United States Patent

Sakurai

[19]

[11] Patent Number: 5,986,515
[45] Date of Patent: Nov. 16, 1999

[54] TEMPERATURE COMPENSATION CRYSTAL OSCILLATOR

[75] Inventor: Yasuhiro Sakurai, Tokorozawa, Japan

[73] Assignee: Citizen Watch Co., Ltd., Tokyo, Japan

[21] Appl. No.: 09/006,931

[22] Filed: Jan. 14, 1998

[30] Foreign Application Priority Data

Jan. 14, 1997 [JP] Japan ................................. 9-004479

[51] Int. Cl.$^6$ ..................................................... H03L 1/02
[52] U.S. Cl. ...................... 331/176; 331/158; 331/177 V
[58] Field of Search ................................. 331/158, 176, 331/177 V

[56] References Cited

U.S. PATENT DOCUMENTS 5,757,244  5/1998  Nonaka et al. ......................... 331/176

OTHER PUBLICATIONS

1996 IEEE International Frequency Control Symposium; Analog TCXO Using One Chip LSI For Mobile Communication; Kuichi Kubo and Shuji Shibuya, pp. 728–734.

*Primary Examiner*—Arnold Kinkead
*Attorney, Agent, or Firm*—Armstrong, Westerman, Hattori, McLeland, & Naughton

[57] ABSTRACT

A temperature compensated crystal oscillator comprises a crystal oscillating circuit having an AT-cut crystal resonator; a linearizing correction circuit for transforming a temperature characteristic curve of an oscillating frequency of the crystal resonator into a straight line using a fixed coefficient common to all crystal resonators; a gradient correction circuit for eliminating the gradient of the linearized temperature characteristic of the oscillating frequency usmg a variable coefficient depending on the type of crystal resonator; and an f0 adjustment circuit for adjusting the gradient corrected temperature characteristic of the oscillating frequency so as to cause the oscillating frequency to lie within an allowable range. Thus, upon the temperature compensation of the oscillating frequency, there are separately performed the linearizing correction, the gradient correction and the f0 adjustment, to achieve a fast temperature compensation adjustment of the oscillating frequency.

12 Claims, 10 Drawing Sheets

○ CRYSTAL OSCILLATOR A
△ CRYSTAL OSCILLATOR B
□ CRYSTAL OSCILLATOR C

○ CRYSTAL OSCILLATOR A
△ CRYSTAL OSCILLATOR B
□ CRYSTAL OSCILLATOR C

TEMPERATURE COMPENSATION CRYSTAL OSCILLATOR

BACKGROUND OF THE INVENTION

1. Field of the Invention

The present invention relates to a temperature compensated crystal oscillator for use in cellular phones and other small-scale electronic devices.

2. Description of the Related Art

Over the past several years, the specifications of temperature compensated crystal oscillators which cellular phone makers demand of crystal oscillator makers have thoroughly changed.

In the past, in order to secure as many telephone lines as possible in a limited frequency band, it was common to compress the frequency band width of each line. Accordingly, it became necessary to make the temperature compensated crystal oscillator frequencies as precise as possible.

However, due to the subsequent enlargement of the frequency band used by cellular phones, the demand switched from precision of frequencies to a demand for low cost light weight temperature compensated crystal oscillator.

In regards to smallness and lightness, products of various crystal oscillator makers are currently roughly the same. This arises from the development of temperature compensated crystal oscillators having the same size in view of mutual compatibility, which therefore results in all such products having substantially the same weight.

As a result of substantially the same performance and dimensions of temperature compensated crystal oscillators, the recent main concern of cellular phone makers with respect to the temperature compensated crystal oscillators is cost.

Thus, in order to maintain price competitiveness and stay ahead in the marketplace, crystal oscillator makers are making every effort to reduce the cost of temperature compensated crystal oscillators.

Incidentally, the temperature compensated crystal oscillator uses as its oscillation source a 10 MHz range AT-cut crystal resonator (crystal unit), which cooperates with any frequency varying means to constitute a temperature compensating circuit thereby canceling the temperature characteristics depend on cubic finction of the AT-cut crystal resonator, to consequently stabilize the oscillating frequency. Depending on the configuration of the temperature compensating circuit, it is roughly classified into an analog temperature compensated crystal oscillator and a digital temperature compensated crystal oscillator.

Furthermore, in recent years, in stead of combining parts, a one chip semiconductor integrated circuit has been used to make an analog temperature compensation crystal oscillator (hereinafter referred to as a one chip analog temperature compensated crystal oscillator), which is disclosed in Kuichi Kubo etc., "1996 IEEE INTERNATIONAL FREQUENCY CONTROL SYMPOSIUM" pp 728–734.

In this publication, the composition of the one chip analog temperature compensated crystal oscillator and the method of adjusting the oscillating frequency basically resembles that for the digital temperature compensated crystal oscillator, with the result that their methods of cost reduction also resemble each other and lowering the cost of adjustment has become a crucial point.

Because analog temperature compensated crystal oscillators compensate temperature by combining electronic parts that have different temperature characteristics, finding the optimum combination of parts and raising the percentage of obtaining passed products without changing the parts, has become a main concern.

Alternatively, another proposal is also disclosed in Japanese Laid-open Patent Pub. No. 6-85538 in which a gradient correction capacitor is used for the analog temperature compensated crystal oscillator in order to secure good frequency precision even in the case of use of inexpensive electronic parts.

In any case, the makers of temperature compensated crystal oscillators are pursuing efforts to reduce the costs of temperature compensated crystal oscillators.

However, temperature compensated crystal oscillators having conventional configurations contain an intrinsic barrier to any real cost reduction.

The analog temperature compensated crystal oscillators involve large parts costs and mounting costs due to too many constituent electronic parts. As well, the cost of refining and readjusting substandard products, found in the inspections at shipment, into passed products, is extremely high.

This is also true for the analog temperature compensated crystal oscillators using the gradient correction capacitor.

In the case of the digital temperature compensated crystal oscillators, it is difficult to achieve reduction of costs due to lack of progress in reducing the costs incurred to write the data for temperature compensation into memory. In addition, since the integrating circuit used to suppress FM noise can not be eliminated, reducing the number of parts is also posing a significant problem.

Although the one chip analog compensated crystal oscillator appears to be superior to the digital temperature compensated crystal oscillator in that the integrating circuit is not necessary, the process of writing of data is nearly the same as that of the digital temperature compensated crystal oscillator. Therefore, the task of lowering this cost is not progressing well. In summary, with the current construction of the conventional temperature compensated crystal oscillator, it is extremely difficult to achieve a substantial reduction in costs.

The present invention was therefore conceived in order to solve the above problems with its object to reduce the costs of the temperature compensated crystal oscillators.

SUMMARY OF THE INVENTION

It is known that a substantially cubic curve is obtained if the temperature variations of the oscillating frequency of the AT-cut crystal resonator are plotted with the abscissa axis representing the temperature and with the ordinate axis representing the oscillating frequency. Due to the unevenness of the cut angles in crystal blocks, individual resonators have different absolute values of oscillating frequencies and different forms of the cubic curves.

It has turned out however that the temperature characteristics of all crystal resonators can be substantially represented by a single cubic curve, by shifting the absolute values of the oscillating frequencies in the direction of the ordinate axis so as to allow all the cubic curves to concentrate at a reference temperature (usually 25° C. in the case of crystal resonators for communications; this step is referred to as f0 adjustment) and by performing at each temperature a correction of the frequency deviation proportional to the difference in temperature relative to the reference temperature to make the gradient of the cubic curve substantially null in the vicinity of the reference temperature (this step is referred to as a gradient correction).

Such superposition of temperature characteristic curves of the oscillating frequencies having various initial characteristics ensures that if the f0 adjustment and the gradient correction are merely performed depending on the unevenness of the manufacture of the crystal resonators, then the remaining correction, that is, the correction for linearizing the superposed cubic curve (this step is referred to as the linearizing correction) can be effected merely by using a coefficient common to all crystal resonators.

For this reason, a temperature compensated crystal oscillator in accordance with the present invention comprises a crystal oscillation means having an AT-cut crystal resonator; a linearizing correction means for transforming a temperature characteristic curve of an oscillating frequency of the crystal resonator into a straight line using a fixed coefficient common to all crystal resonators; a gradient correction means for eliminating a gradient of the linearized temperature characteristic of the oscillating frequency using a variable coefficient depending on the type of crystal resonator; and an f0 adjustment means for adjusting the gradient corrected temperature characteristic of the oscillating frequency so as to cause the oscillating frequency to lie within an allowable range.

This configuration enables the temperature compensation to be divided into a linearizing correction, a gradient correction and an f0 adjustment, thereby extremely simplifying the adjustment of the oscillating frequency of the crystal resonator.

That is, the linearizing correction does not need any adjustment since it is common to all such crystal resonators, and the temperature characteristic curve of the oscillating frequency is linearized through this correction, so that the coefficient for the gradient correction can be obtained using only the temperature information on two different points.

In addition, the f0 adjustment is carried out at a reference temperature, so that by employing one of the temperatures at the two different points as the reference temperature, the temperature information of only one point besides the reference temperature has only to be used to complete the adjustment of the temperature compensated crystal oscillator.

This means that the temperature compensated crystal oscillator in accordance with the present invention is able to reduce the adjustment costs for temperature compensation to a large extent as compared with the conventional digital temperature compensated crystal oscillator requiring temperature information of at least four points to obtain a cubic curve of the crystal resonator.

Thus, the present invention is capable of shortening the time taken for the adjustment of the oscillating frequency (the temperature compensation), making it possible to achieve a lowered price for the temperature compensated crystal oscillator.

The above and other objects, features and advantages of the present invention will become more apparent from the following detailed description which is to be read in conjunction with the accompanying drawings.

DETAILED DESCRIPTION OF THE PREFERRED EMBODIMENTS

Embodiments of the present invention will now be described with reference to the accompanying drawings. Overview of temperature compensation for crystal oscillators in accordance with the present invention: FIGS. 8 to 12

Figure 8:
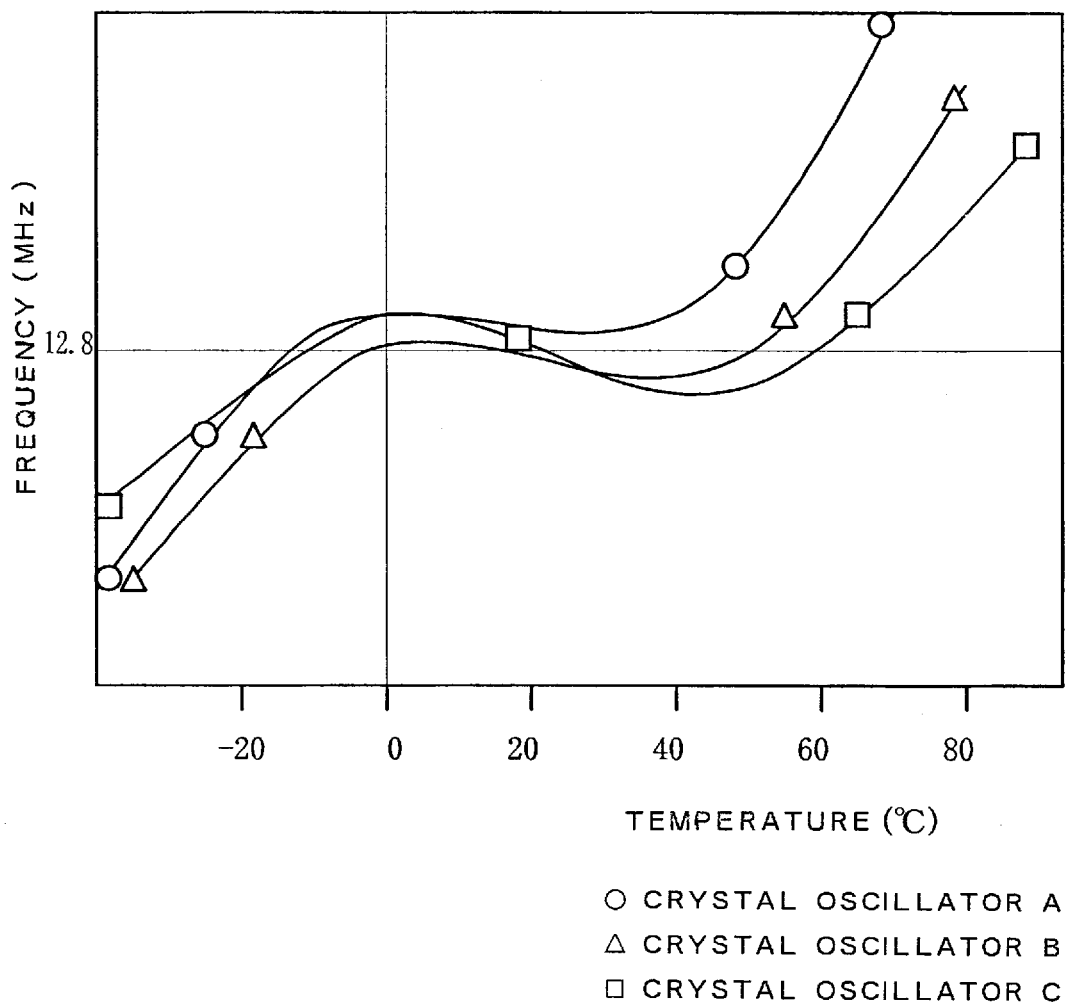
FIG. 8 is a graph of the temperature characteristics versus oscillation frequencies of three crystal oscillators.

FIG. 8 is a graphic representation of the temperature characteristics of the oscillating frequency of plural crystal oscillators A, B and C, which are respectively indicated by circular, triangular and square plots.

Due to the temperature characteristics of their respective AT-cut crystal resonators, as shown in FIG. 8, the crystal oscillators have oscillating frequencies presenting different temperature characteristics expressed by cubic curves.

Figure 9:
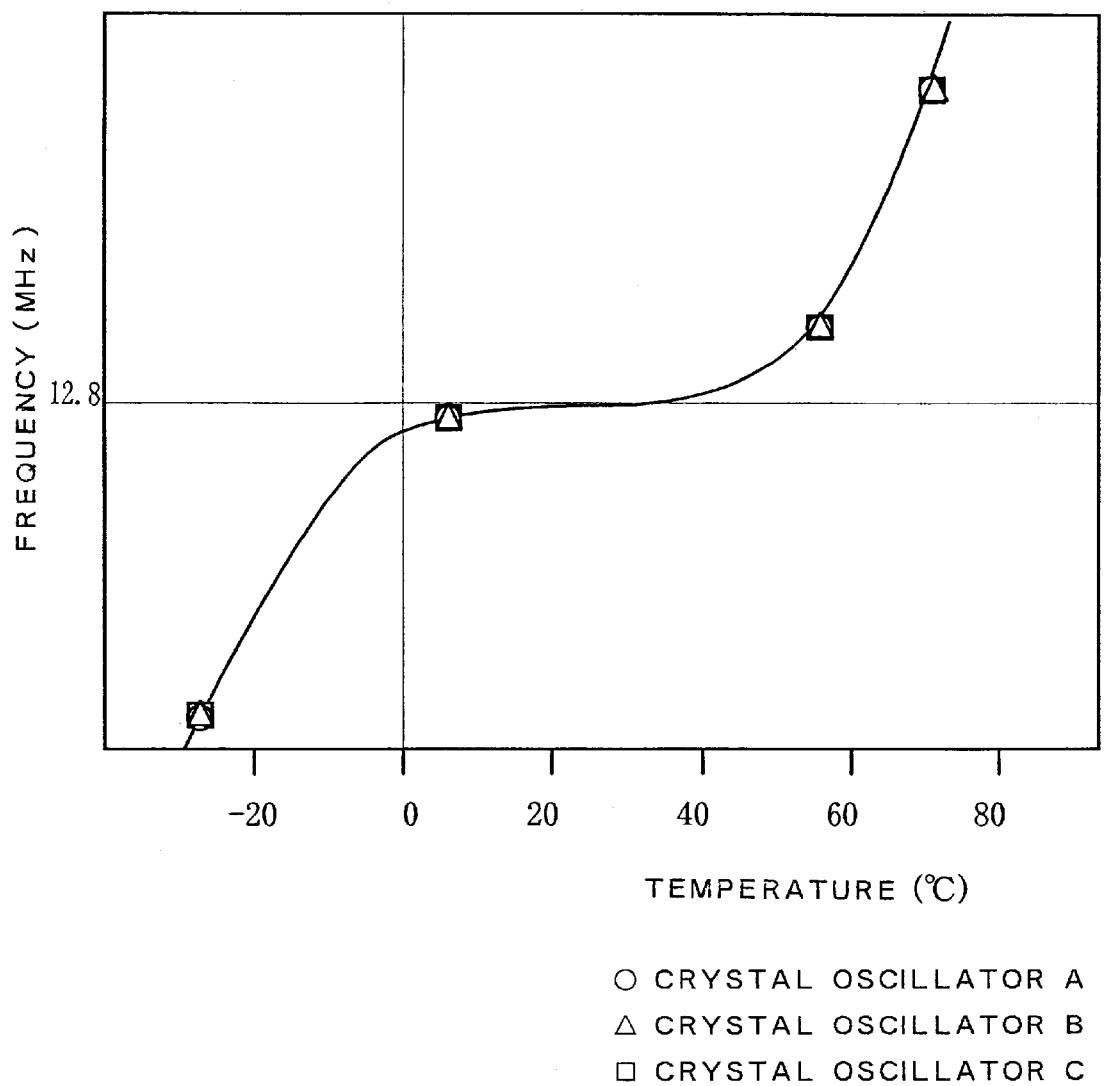
FIG. 9 is a graph of the curves of FIG. 8 subjected to synchronization.

Although the cubic curves of these characteristics are different from one another, they merely have different rotational angles relative to the frequency axis and the temperature axis, with their profiles being substantially the same. The cubic curves therefore coincide with one another, as shown in FIG. 9, if their rotational angles are corrected so as to be synchronized. This can be considered as being due to temperature characteristics intrinsic to the AT-cut crystal resonators (hereinafter, referred to as basic temperature characteristics), independent of any manufacturing differences or errors.

Thus, in the temperature compensation for the crystal oscillators in accordance with the present invention, compensation for the temperature characteristics of each crystal oscillator includes the compensation for the basic temperature characteristics shown in FIG. 9, the compensation for the rotational angle thereof, and f0 adjustment.

Figure 10:
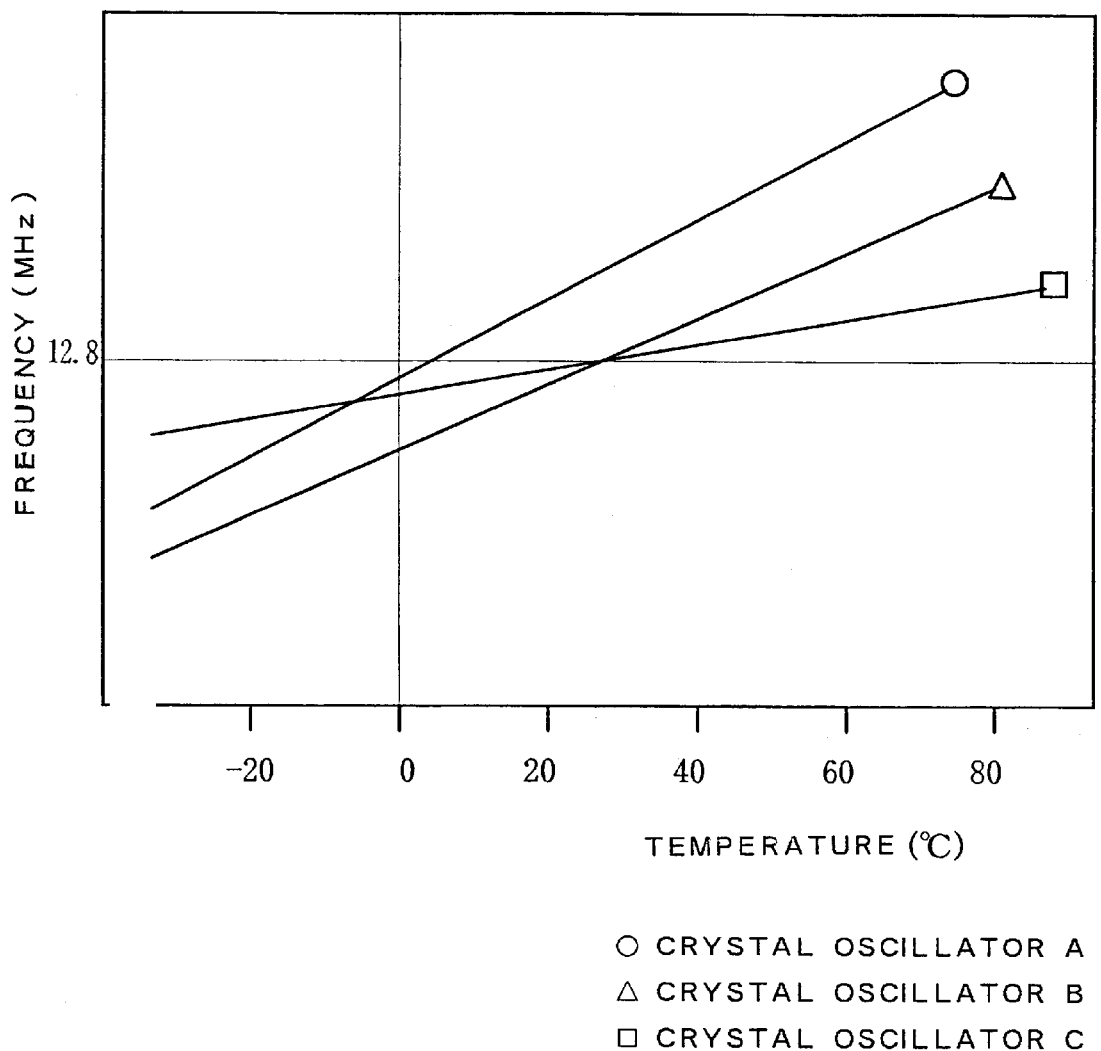
FIG. 10 is a graph of the curves of FIG. 9 subjected to linearizing correction.

To this end, a linearizing correction is first carried out using a fixed coefficient for linearizing the basic temperature characteristics shown in FIG. 9. As a result, the characteristic curves of the crystal oscillators A, B and C shown in FIG. 8 result in straight lines having different gradients as shown in FIG. 10. Although the straight lines in the case of the linearizing correction do not mean mathematically perfect straight lines but mean linear belts having widths of frequency deviation allowable as those of the temperature compensated crystal oscillators, they are illustrated as straight lines for convenience in the embodiments of the present invention and drawings.

Figure 11:
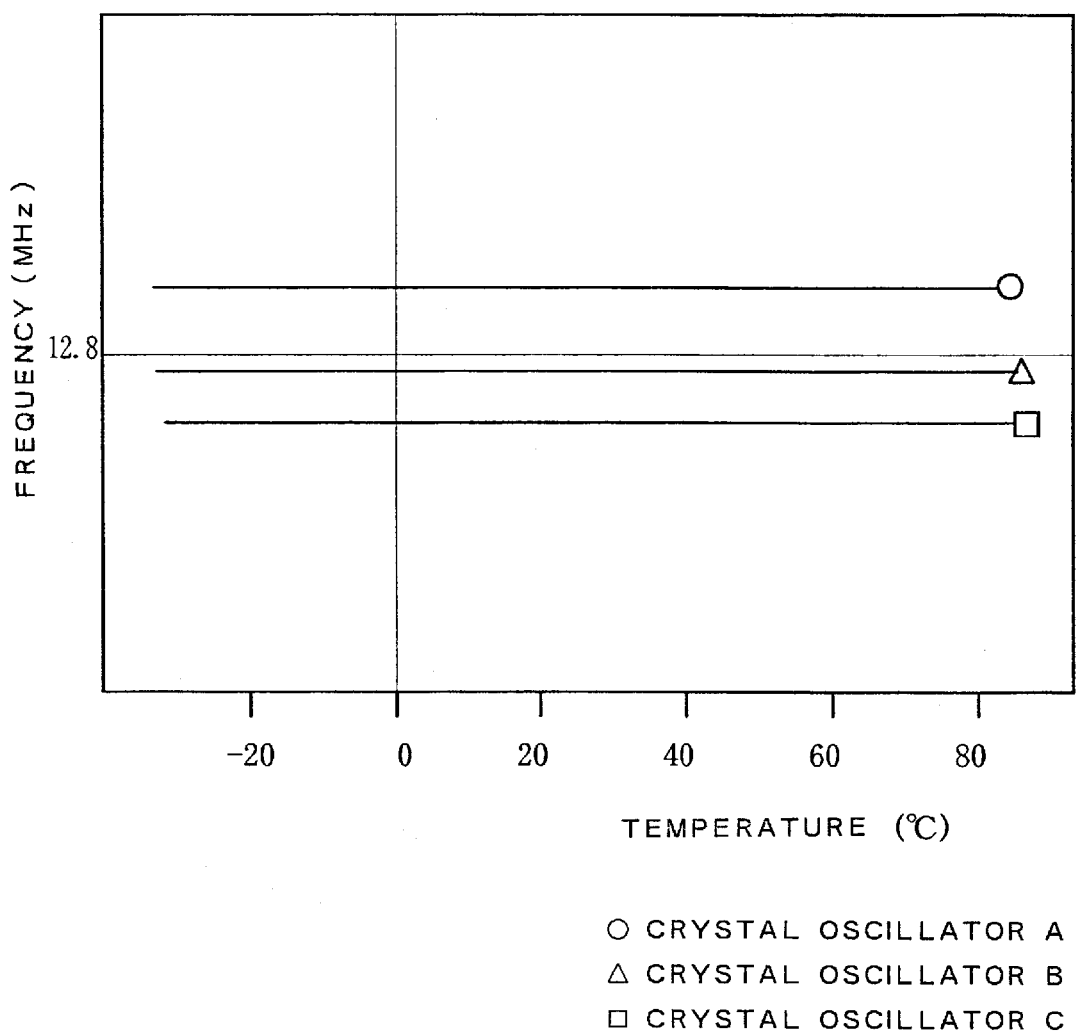
FIG. 11 is a graph of the curves of FIG. 10 with their different gradients removed.
Figure 12:
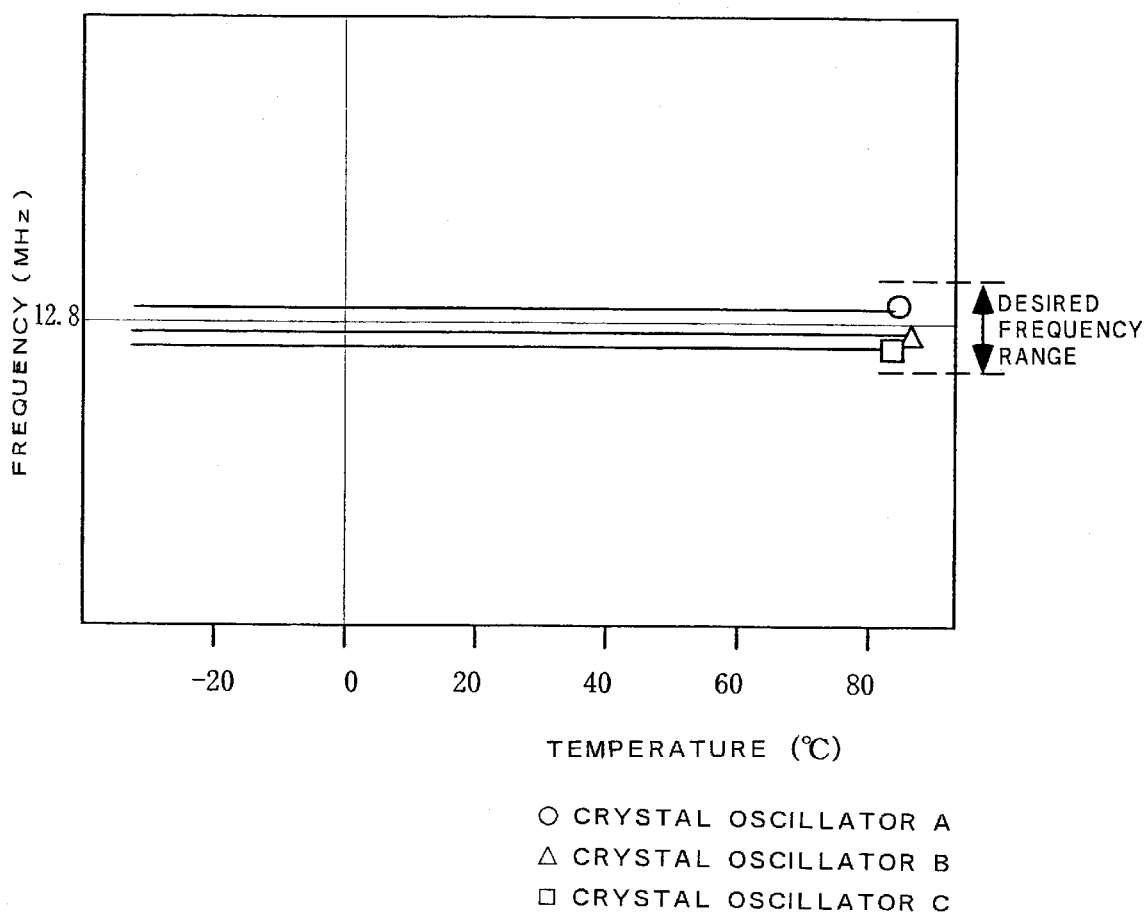
FIG. 12 is a graph of the curves of FIG. 11 subjected to an f0 adjustment.

The crystal oscillators A, B and C are then subjected to a gradient correction for eliminating the respective gradients using different coefficients. In consequence, the characteristic lines of the crystal oscillators A, B and C shown in FIG. 10 result in straight lines parallel to the temperature axis with no gradients, but with different oscillating frequencies, as shown in FIG. 11. An adjustment (f0 adjustment) is then performed for frequency deviation so as to cause the characteristics of the crystal oscillators A, B and C shown in FIG. 11 to lie within a desired oscillating frequency range. Thus, the crystal oscillators shown in FIG. 11 can obtain oscillations within the desired oscillating frequency range, independent of the temperature, as shown in FIG. 12.

As hereinbefore described, in the case of the conventional temperature compensated crystal oscillators, each crystal oscillator has been subjected to compensation in which the cubic curve indicative of the oscillating frequency vs. temperature characteristics as shown in FIG. 8 is processed intact, so that a larger compensation circuit and excessive labor time for the compensating adjustment is required, resulting in increased production costs.

On the contrary, according to the present invention, the temperature compensation for the oscillation frequency consists separately of the linearizing correction, gradient correction and f0 adjustment as herein described, so that the linearizing correction is fixed and need not be altered, with the actually performed gradient correction being a processing conscious of the linear curve, and with the f0 adjustment being mere processing at the temperature at a certain reference point, thus making it possible to reduce the size of the compensation circuit as compared with the conventional compensation in which the cubic curve is directly processed, as well as ensuring a simple compensation adjustment, contributing to a significant reduction in production costs.

Since the linearizing correction is carried out using a fixed coefficient common to the crystal oscillators, only the gradient correction and f0 adjustment require any actual adjustment for the temperature compensation.

Figure 1:
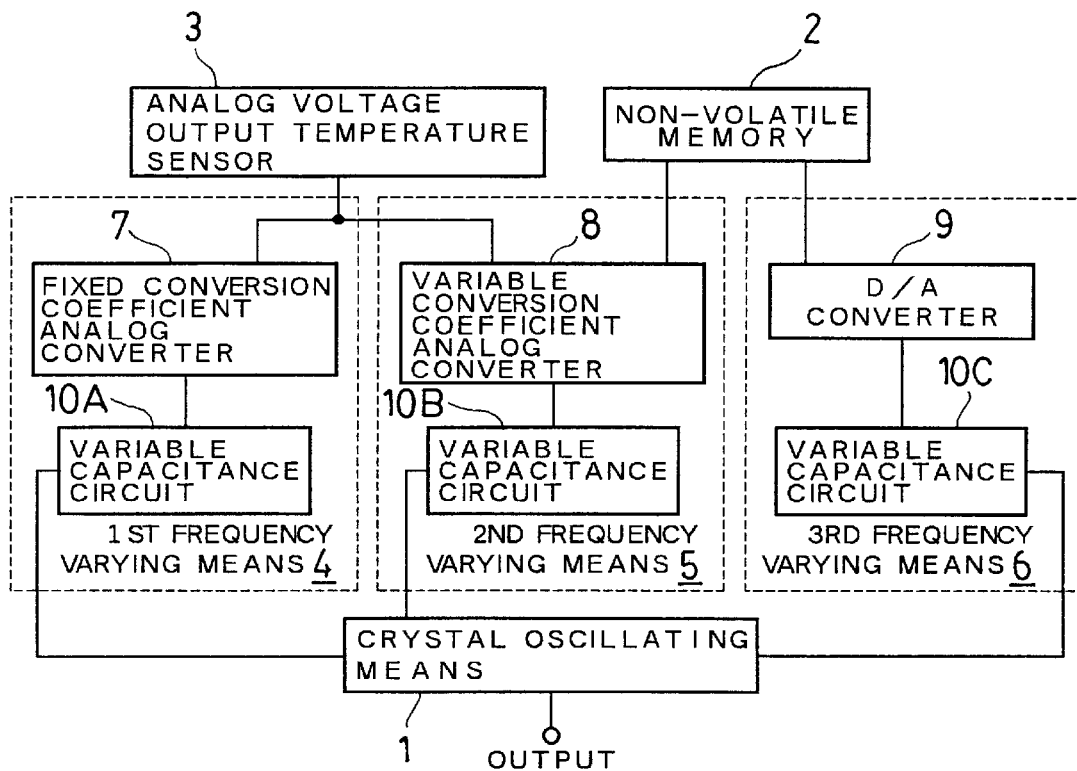
FIG. 1 is a block diagram showing a configuration of a temperature compensated crystal oscillator in accordance with the first embodiment of the present invention.
Figure 2:
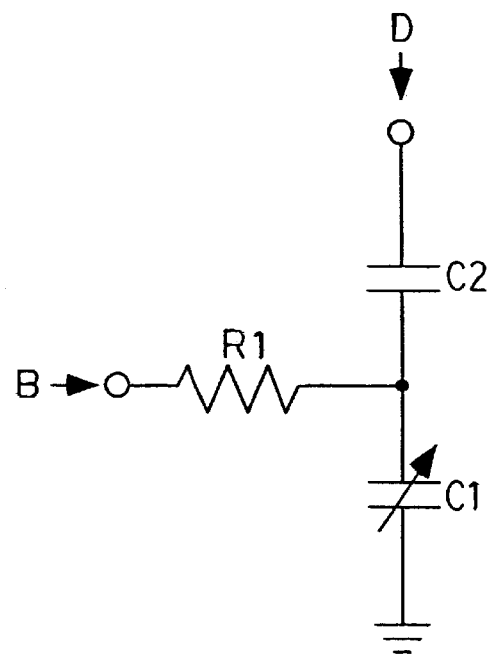
FIG. 2 is a circuit diagram showing an example of the configuration of a variable capacitance circuit in FIG. 1.
Figure 3:
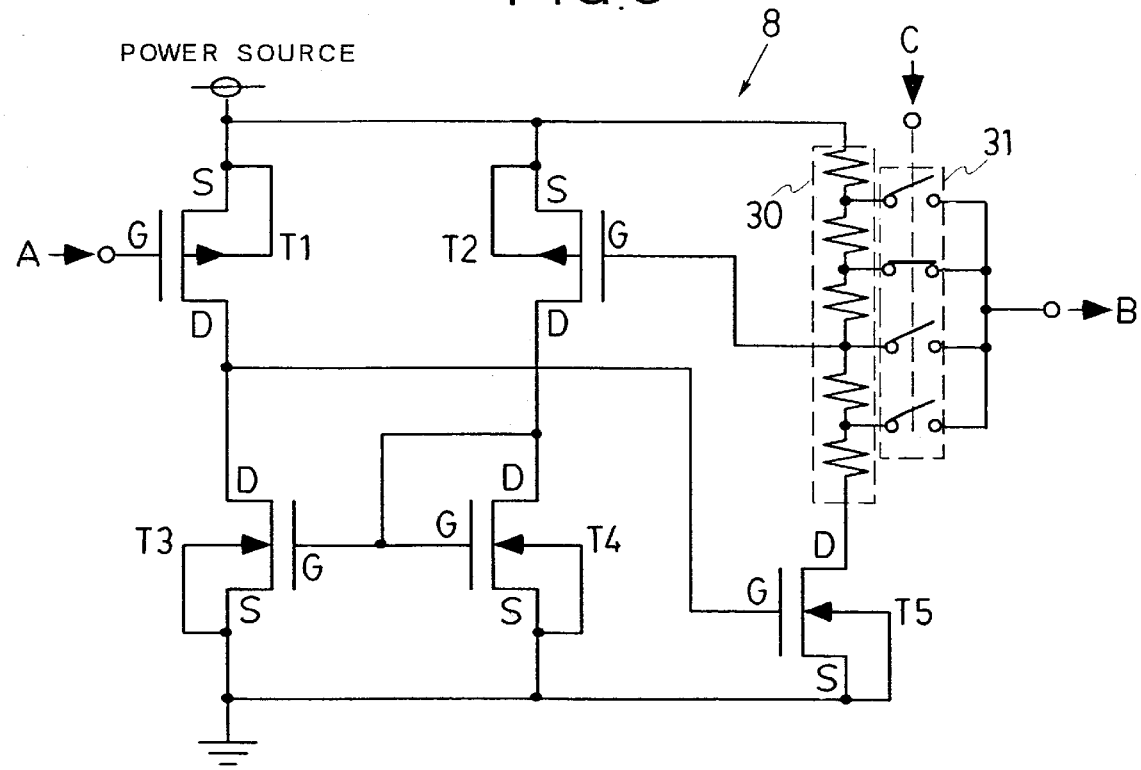
FIG. 3 is a circuit diagram showing an example of the configuration of a variable conversion coefficient analog converter in FIG. 1.

First embodiment: FIGS. 1 to 3

Referring to a block diagram illustrated in FIG. 1, description will now be made of a configuration of a temperature compensated crystal oscillator in accordance with a first embodiment of the present invention.

The temperature compensated crystal oscillator comprises, as shown in FIG. 1, crystal oscillating means 1 having an AT-cut crystal resonator; a non-volatile memory 2 storing therein gradient information on the temperature characteristics of the AT-cut crystal resonator and f0 adjustment information; an analog voltage output temperature sensor 3 for providing in the form of analog signals the temperature information on the AT-cut crystal resonator; and first frequency varying means 4, second frequency varying means 5 and third frequency varying means 6, which are connected in parallel with the crystal oscillating means 1.

The first frequency varying means 4 includes a fixed conversion coefficient analog converter (a first analog converter) 7 which converts the output voltage of the analog voltage output temperature sensor 3 into an other voltage with a fixed conversion coefficient, and a variable capacitance circuit (a first variable capacitance circuit) 10A which varies the capacitance of the crystal oscillating means 1 in response to the output signals from the analog converter 7.

The first frequency varying means 4 serves as linearizing correction means for carrying out the linearizing correction for approximating to a single straight line the cubic curve indicative of the temperature characteristics of the AT-cut crystal resonator, with the analog converter 7 serving as an inverted cubic curve generating circuit for generating an inverted cubic curve as a result of inversion of the cubic curve or serving as an inverted cubic curve line-approximation generating circuit.

The variable capacitance circuit 10A includes, as shown in FIG. 2 for instance, a variable capacitance element C1 and a DC cut capacitor C2 which are connected in series, with the series connection acting as a load for the crystal oscillating means 1 and being grounded.

In order to control the capacitance value of the variable capacitance element C1, a control signal B from the analog converter 7 for instance is applied through an input resistor R1 to a connection point between the variable capacitance element C1 and the capacitor C2.

Although a very typical example of the variable capacitance circuit is illustrated in FIG. 2, the elements are subjected to some restrictions for use in the temperature compensated crystal oscillator.

That is, the variable capacitance element C1 can be any element as long as it is of a voltage controlled type, but preferably it is a MOS capacitor in view of its easy incorporation into a semiconductor integrated circuit. Furthermore, although the variable capacitance circuit is connected to ground in the example shown in FIG. 2, it may be connected to any potential that ensures, a large variable width of the capacitance values since any DC potential at the object to be connected is ignored.

The DC cut capacitor C2 is preferably a voltage independent capacitor, but this condition is not essential if it has a larger capacitance value than that of the variable capacitance element C1. Instead, in order not to reduce the variable width of the capacitance value of the variable capacitance element C1, a significant condition is that its stray capacitance must be extremely small.

The input resistor R1 can be of the order of 1 M Q. However, a diffused resistor or a MOS resistor is not preferred since use of such an element having a large stray capacitance causes a reduction in the variable width of the capacitance value of the variable capacitance element C1. In view of the incorporation into the semiconductor integrated circuit, a polycrystalline silicon resistor is most preferred.

The second frequency varying means 5 serve as gradient correction means for correcting the gradient of the temperature characteristics of the AT-cut crystal resonator, which has been subjected to the linearizing correction by the first frequency varying means 4. The second frequency varying means 5 includes a variable conversion coefficient analog converter (a second analog converter) 8 for converting an output voltage of the analog voltage output temperature sensor 3 into another voltage with the conversion coefficient varied, on the basis of gradient correction information stored in the non-volatile memory 2; and a variable capacitance circuit (a second variable capacitance circuit) 10B which varies the capacitance of the crystal oscillating means 1 in response to an output signal of the analog converter 8.

The analog converter 8 consists, as shown in FIG. 3 for instance, of a series connection of a first p-channel MOS transistor T1 and a first n-channel MOS transistor T3, of a series connection of a second p-channel MOS transistor T2 and a second n-channel MOS transistor T4, and of a series connection of a resistor train 30 including a plurality of resistors which are connected in series and a third n-channel MOS transistor T5, with the three series connections being connected in parallel between the power source and ground.

The gate of the first n-channel MOS transistor T3 is connected to both the gate and drain of the second n-channel MOS transistor T4, with the gate of the third n-channel MOS transistor T5 being connected to the drain of the first p-channel MOS transistor T1.

Connected to connection points between the adjacent resistors of the resistor train 30 are a group of switches 31 whose opening and closing actions are controlled by a control signal C from the non-volatile memory 2 and whose other ends are connected together to provide a control signal B to the variable capacitance circuit 10B.

The gate of the first p-channel MOS transistor T1 receives a signal A from the analog voltage output temperature sensor 3. The gate of the second p-channel MOS transistor T2 is connected to one of the connection points between the adjacent resistors of the resistor train 30.

The variable conversion coefficient analog converter 8 shown in FIG. 3 is in the form of a forward amplifying circuit using a CMOS operational amplifier by way of example and is able to vary the conversion coefficient used when converting signal A from the analog voltage output temperature sensor 3 into a control signal B to be fed to the variable capacitance circuit 10B, by changing over the switches to the closed state in response to a control signal C from the non-volatile memory 2.

It is to be appreciated that the variable conversion coefficient analog converter 8 is not limited to a forward amplifying circuit and that an inversion amplifying circuit is also available if an inverted signal of the signal A from the analog voltage output temperature sensor 3 is required as the control signal B to be fed to the variable capacitance circuit 10B. By use of the resistor train 30 and the associated switches 31, the inversion amplifying circuit is also able to vary the conversion coefficient.

Although in FIG. 3 the group of switches 31 are depicted as mechanical switches for the simplicity of representation, they actually are comprised of CMOS switches for example due to being incorporated into the semiconductor integrated circuit.

An example of the variable conversion coefficient analog converter 8 has been hereinabove described with reference to FIG. 3. In respect to the fixed conversion coefficient analog converter 7 shown in FIG. 1, the illustration and description of a specific circuit example will be omitted since the group of switches 31 have only to be excluded from the variable conversion coefficient analog converter 8.

The third frequency varying means 6 in FIG. 1 serve as f0 adjustment means for performing the f0 adjustment (the adjustment for causing the oscillating frequency deviation of the crystal oscillating circuit 1 to lie within a predetermined width) of the AT-cut crystal resonator temperature characteristics whose gradient is corrected by the second frequency varying means 5. The third frequency varying means 6 includes a D/A converter 9 for converting the f0 adjustment information output from the non-volatile memory 2 into an analog voltage, and a variable capacitance circuit (a third variable capacitance circuit) 10C for varying the capacitance of the crystal oscillating means 1 in response to an output signal from the D/A converter 9.

Description will then be made of a method of adjusting the temperature compensation in the temperature compensated crystal oscillator in accordance with the first embodiment.

In the case of this temperature compensated crystal oscillator, as shown in FIG. 1, signals for the linearizing correction are generated by the fixed conversion coefficient analog converter 7 so that there is no need to perform any adjustment for the linearizing correction after the assembly of the temperature compensated crystal oscillator, thus achieving zero adjustment cost.

In cases where the temperature characteristics of the AT-cut crystal resonator from the analog voltage output temperature sensor 3 are linearized, the relationship of a linear function is established between the temperature and the oscillating frequency, so that if information on the oscillating frequency at the temperatures at any two points is obtained, the gradient correction will be achieved by multiplying a correction coefficient proportional to a difference in temperature.

Although the two points may have any temperature, it is preferred that the temperature at one point normally be 25° C. with the other point having any arbitrary temperature, since the f0 adjustment is effected at the reference temperature of 25° C.

Thus, this temperature compensated crystal oscillator completes all the adjutants by use of temperature information from only two points. That is, the non-volatile memory 2 has only to store the gradient correction information and the f0 adjustment information in conformity with the temperature information from two points.

This achieves a remarkable curtailment of the adjustment costs as compared with the conventional digital temperature compensated crystal oscillator or the single-chip analog temperature compensated crystal oscillator, which requires information from at least four points in order to obtain a cubic curve of the crystal resonator.

It may be considered on the other hand that the temperature compensated crystal oscillator of the present invention needs a larger adjustment cost as compared with the conventional analog temperature compensated crystal oscillator requiring only the f0 adjustment after assembly. However, the analog temperature compensated crystal oscillator actually needs substantially the same cost as that of the gradient compensation means of the temperature compensated crystal oscillator of this embodiment in the step of selecting components before the assembly. Hence, this temperature compensated crystal oscillator and the conventional analog temperature compensated crystal oscillator incur substantially the same adjustment costs prior to inspection at shipment.

Comparing the costs for realigning defective crystal oscillator products found to be out of specification during inspection at shipment into non-defective products, the conventional analog temperature compensated crystal oscillator incurs a substantial cost because of the replacement of soldered components, whereas with the temperature compensated crystal oscillator in accordance with the present invention, it is only necessary to rewrite the content of the gradient correction information and the f0 adjustment information stored in the non-volatile memory on the basis of data obtained through the inspection at shipment, thus incurring a very small or substantially no cost.

From an overall viewpoint, therefore, the temperature compensated crystal oscillator of this embodiment can achieve a reduction in the adjustment cost as compared with the conventional analog temperature compensated crystal oscillator.

Furthermore, unlike the digital temperature compensated crystal oscillator, the control signals are not allowed to digitally sharply vary with variations of the temperature, since when obtaining control signals for the variable capacitance circuits 10B and 10C from the temperature information, in the case of the temperature compensated crystal oscillator as shown in FIG. 1, the analog voltage output temperature sensor 3 provides the temperature information as analog signal outputs, which in turn are converted into other analog signals by the fixed conversion coefficient analog converter 7 or the variable conversion coefficient analog converter 8, with the post-conversion analog signals being used intact as the control signals for the variable capacitance circuits 10B and 10C.

Accordingly, this temperature compensated crystal oscillator does not need any integration circuit as in the digital temperature compensated crystal oscillator, making it possible to reduce the number of constituent parts.

It is apparent that this temperature compensated crystal oscillator is able to realize a low price with a reduction in the mounting costs due to the reduced number of constituent components and simplified processing.

As is apparent from the above description, according to the first embodiment of the present invention hereinbefore described, there can be achieved a low-price temperature compensated crystal oscillator due to the reduction in the adjustment cost and in the mounting cost.

It is to be noted that as shown in FIG. 1 the three frequency varying means are connected in parallel with the crystal oscillating means 1, which is a preferred connection in order to minimize the influence of each frequency varying means on the other frequency varying means, and hence any series connection is prohibited if it has no means for outputting the output signals of these three frequency varying means together without being affected by one another.

Figure 4:
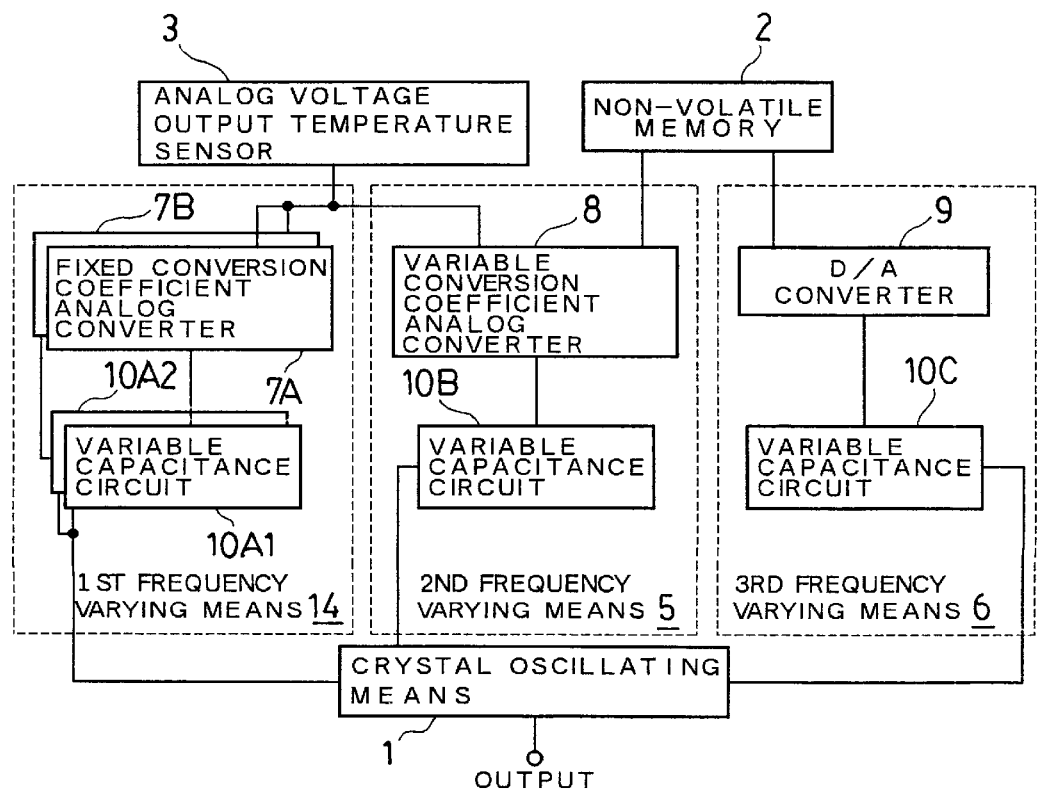
FIG. 4 is a block diagram showing a configuration of a temperature compensated crystal oscillator in accordance with the second embodiment of the present invention.
Figure 5:
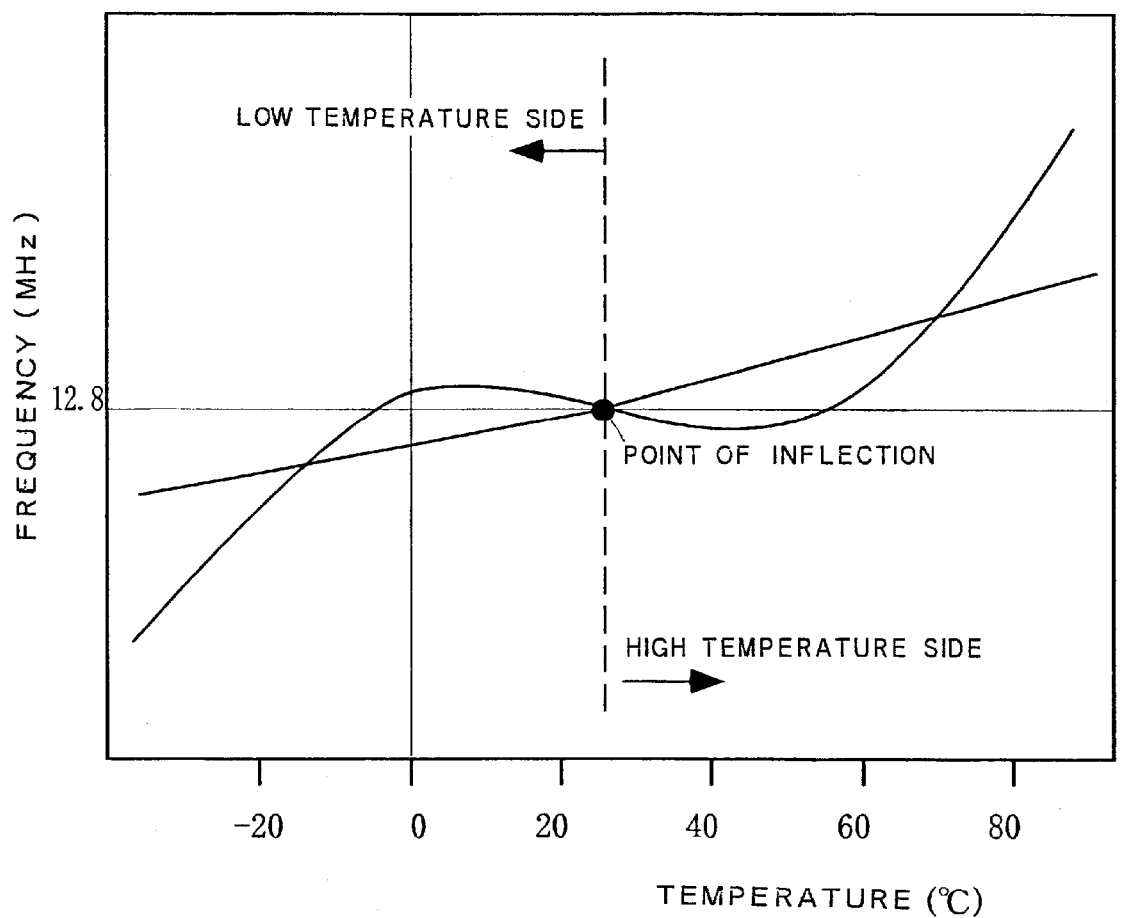
FIGS. 5 and 6 are graphic representations for explaining a temperature compensation adjustment in the second embodiment shown in FIG. 4.
Figure 6:
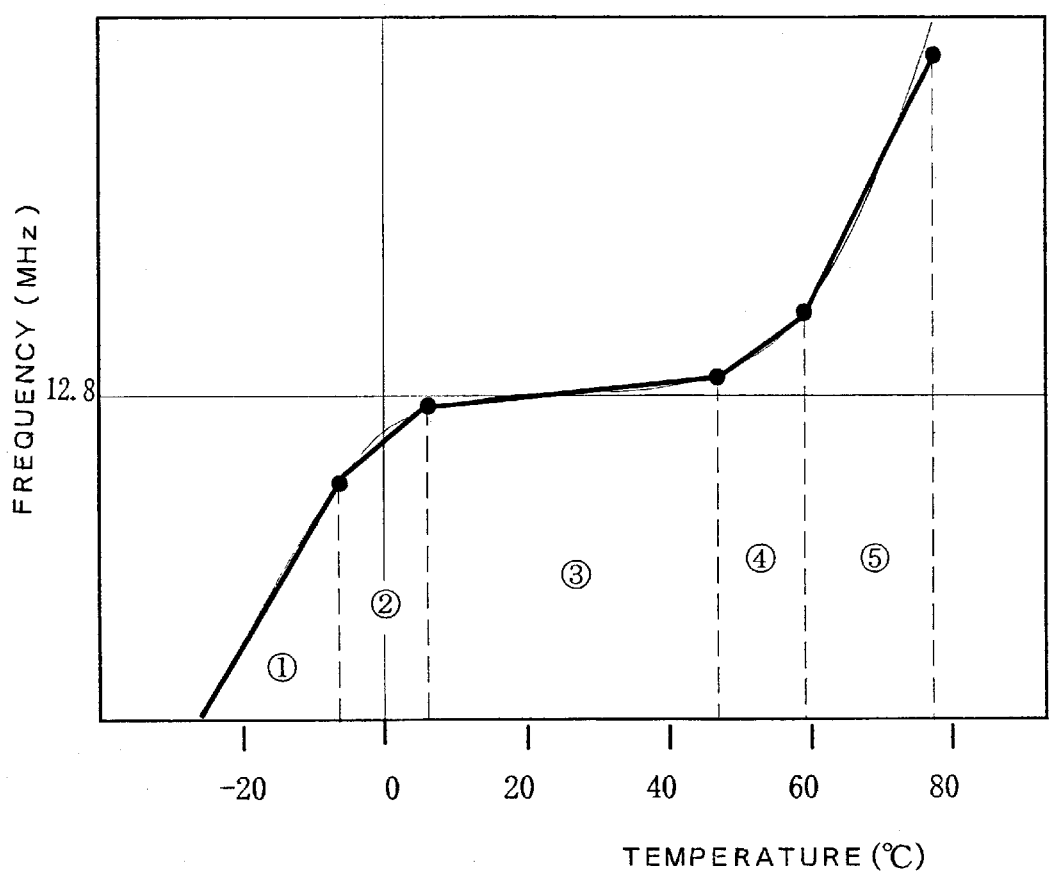

Second embodiment: FIGS. 4 to 6

Referring to the block diagram illustrated in FIG. 4, description will now be made of a configuration of a temperature compensated crystal oscillator in accordance with a second embodiment of the present invention.

The temperature compensated crystal oscillator of the second embodiment comprises, as shown in FIG. 4, the crystal oscillating means 1 consisting of the AT-cut crystal resonator; and first frequency varying means 14, the second frequency varying means 5 and the third frequency varying means 6, which are connected in parallel with the crystal oscillating means 1.

The first frequency variable means 14 includes a plurality of fixed conversion coefficient analog converters (first analog converters) 7A, 7B, and a plurality of variable capacitance circuits (first variable capacitance circuits) 10A1, 10A2, with the capacitance values of these variable capacitance circuits 10A1, 10A2 being controlled by the analog converters 7A, 7B, respectively.

Incidentally, description will be omitted of the second frequency varying means 5 and the third frequency varying means 6 because of their having the same configuration as those in the first embodiment hereinabove described.

Therefore, the temperature compensated crystal oscillator of this second embodiment differs from that of the first embodiment shown in FIG. 1 in that the first frequency varying means 14 is provided including a plurality of variable capacitance circuits and accordingly the plurality of fixed conversion coefficient analog converters 7A, 7B are provided for the control of the associated variable capacitance circuits 10A1, 10A2.

That is, the difference lies in that the linearizing correction is not carried out by a single variable capacitance circuit 10A, but is effected by a plurality of variable capacitance circuits, 10A1, 10A2.

As hereinabove described, the linearizing correction is a correction for approximating to a single straight line a cubic line which is centrosymmetric with respect to a point of inflection, and hence the correction can be performed in a centrosymmetric manner if the straight line is selected so as to pass through the point of inflection.

The execution of the centrosymmetrical linearizing correction with respect to the point of inflection results in the fact that the directions of correction for linearization are opposite with respect to the point of inflection, and means that in order to realize such a correction using a single variable capacitance circuit, the output of the analog converter 7 for the control of the capacitance value is expected to act in an extremely complicated manner on the temperature.

The thus acting analog converter 7 has an enlarged circuit scale and becomes complicated, so that it may be difficult to set an optimum conversion coefficient. In order to obviate such a difficulty, there is a method in which separate variable capacitance circuits independently control the high-temperature side and the low-temperature side with respect to the point of inflection in the temperature characteristics of the AT-cut crystal resonator shown in FIG. 5.

Thus, in the second embodiment as shown in FIG. 4, the first frequency varying means 4 includes a plurality of variable capacitance circuits 10A1, 10A2, and a plurality of analog converters 7 for controlling the plurality of variable capacitance circuits 10A1, 10A2.

More specifically, the first frequency varying means in this embodiment divides the temperature range to be compensated into a plurality of segments, with the fixed conversion coefficient analog converter thereof consisting of a plurality of analog converters 7A, 7b which voltage convert the output voltage of the analog voltage output type temperature sensor 3 using conversion coefficients differing on a segment-by-segment basis within the temperature range. The first variable capacitance circuit consists of a plurality of variable capacitance circuits 10A, 10B which vary the capacitance of the crystal oscillating means 1 in response to the output signals of the plurality of analog converters 7A, 7B.

This simplifies the circuit configuration of the first frequency varying means 4 and facilitates the setting of the fixed conversion coefficients.

Although in the second embodiment the temperature range to be compensated is divided by way of example into two segments, that is, the high temperature side and the low temperature side with respect to the point of inflection of the cubic curve indicative of the temperature characteristics of the AT-cut crystal resonator, this is not intended to be limitative and it may be subdivided to achieve a more accurate linearizing correction.

For example, as shown in FIG. 6, the cubic curve indicative of the temperature characteristics of the AT-cut crystal resonator may be divided into five predetermined temperature segments ($\hat{1}$ to $\hat{5}$ in the diagram). In this case, five sets of analog converters (each having a different fixed conversion coefficient) and variable capacitance circuits are provided so as to separately perform the linearizing correction within the respective temperature segments, thereby achieving a more accurate linearizing correction.

In cases where the AT-cut crystal resonator has a large allowable width of oscillating frequency as in the example shown in FIG. 6, it may be supposed that temperature segments $\hat{1}$ and $\hat{5}$ have substantially the same gradient and that segments $\hat{2}$ and $\hat{4}$ have also substantially the same gradient, which makes it possible to share the same variable capacitance circuit, so that provision of only three sets of fixed conversion coefficient analog converters and variable capacitance circuits ensures an accurate linearizing correction. Thus, a more accurate linearizing correction can be effected by use of a more simplified circuit.

Figure 7:
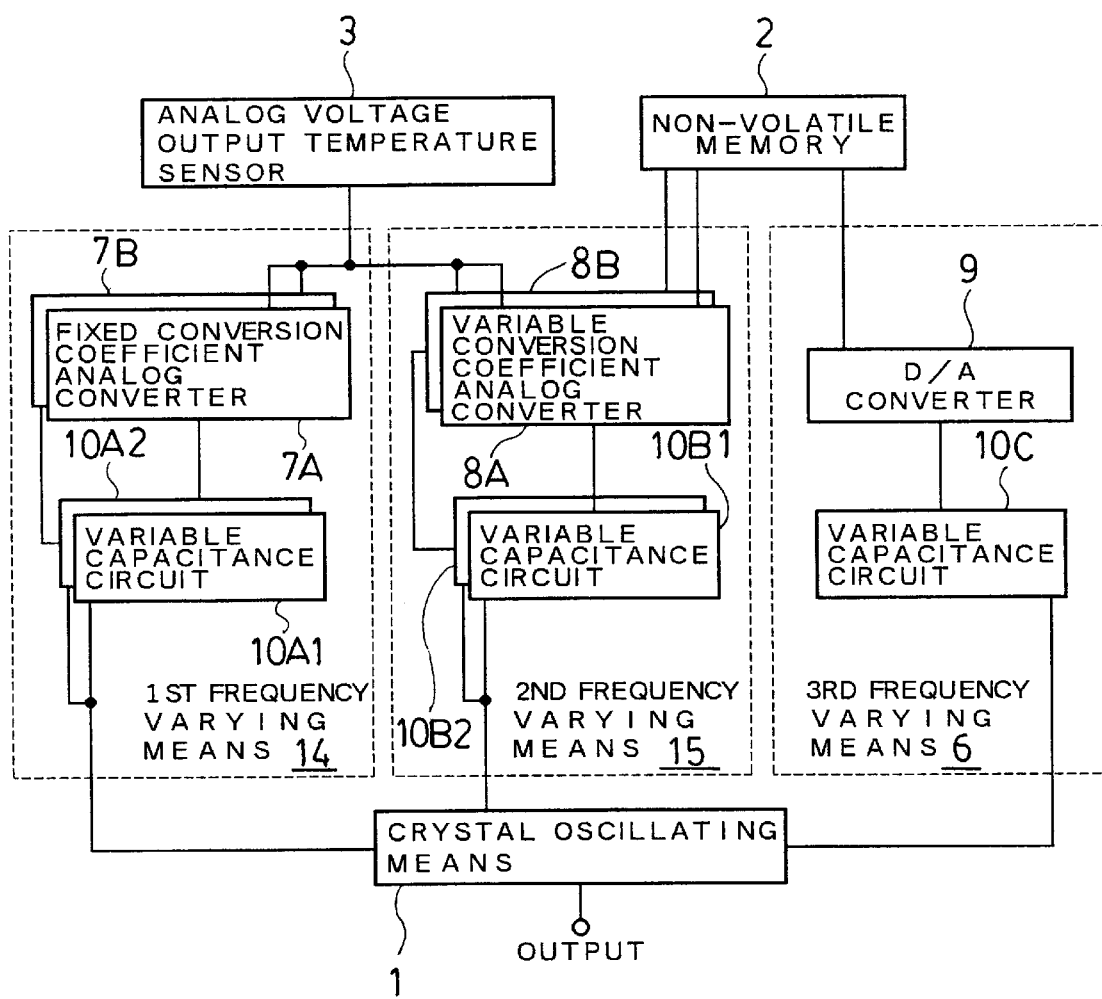
FIG. 7 is a block diagram showing a configuration of a temperature compensated crystal oscillator in accordance with the third embodiment of the present invention.

Third embodiment: FIG. 7

Referring to the block diagram illustrated in FIG. 7, description will now be made of a configuration of a temperature compensated crystal oscillator in accordance with a third embodiment of the present invention.

The temperature compensated crystal oscillator of the third embodiment comprises, as shown in FIG. 7, the crystal oscillating means 1 including the AT-cut crystal resonator; and the first frequency varying means 14, second frequency varying means 15 and the third frequency varying means 6, which are connected in parallel with the crystal oscillating means 1.

In the same manner as the second embodiment hereinbefore described, the first frequency varying means 14 consist of a plurality of fixed conversion coefficient analog converters 7A, 7B which are connected in parallel, and a plurality of variable capacitance circuits 10A1, 10A2, with the capacitance values of the variable capacitance circuits 10A1, 10A2 being controlled by the analog converters 7A, 7B, respectively.

The second frequency varying means 15 consists of a plurality of variable conversion coefficient analog converters 8A, 8B (second analog converters) which are connected in parallel, and a plurality of variable capacitance circuits (second variable capacitance circuits) 10B1, 10B2, with the capacitance values of the variable capacitance circuits 10B1, 10B2 being controlled by the analog converters 8A, 8B, respectively.

The third frequency varying means 6 is the same as that of the first embodiment hereinabove described.

The temperature compensated crystal oscillator of the third embodiment differs from the second embodiment shown in FIG. 4 in that the second frequency varying means 15 consists of a plurality of variable capacitance circuits and that there are correspondingly provided a plurality of variable conversion coefficient analog converters 8A, 8B in order to control the variable capacitance circuits 10B1, 10B2.

In other words, the difference lies in that the gradient correction is carried out by a plurality of variable capacitance circuits 10B1, 10B2, not by a single variable capacitance circuit 10B.

In the case of the method of performing the gradient correction on the basis of both the oscillating frequency at the reference temperature and the oscillating frequency at any other temperature, as described in the first embodiment, it is possible in many cases to make the linearized temperature gradient of the oscillating frequency substantially zero over the entire temperature range used.

However, certain AT-cut crystal resonators present temperature characteristic curves fairly distorted from a cubic curve. In the case of such crystal resonators, the frequency accuracy often deviates from the standard within a temperature region opposite, with respect to the reference temperature, to a temperature region determining the gradient correction coefficient.

In order to allow the frequency accuracy to lie within the standard of the temperature compensated crystal oscillator even in case of the use of such defective crystal resonator, separate gradient corrections must be applied on the high temperature side and the low temperature side with respect to the reference temperature.

Then, the provision of a plurality of variable capacitance circuits within the second frequency variable means 5 is the easiest measure for applying separate gradient corrections on the high temperature side and the low temperature side with respect to the reference temperature.

Thus, the third embodiment shown in FIG. 7 provides an effective configuration for allowing the frequency accuracy to lie within the standard even in a case where the AT-cut crystal resonator used as the oscillation source for the temperature compensated crystal oscillator presents a defective temperature characteristic curve.

Also, in the case of the third embodiment, the adjustment costs for the gradient correction are substantially the same as in the first embodiment. This is due to the fact that the gradient correction is applied temporarily using the same values of the conversion coefficients of the plurality of variable conversion coefficient analog converters 8A, 8B in the same manner as in the first embodiment and, if the oscillating frequency in the temperature region on the opposite side deviates from the standard during inspection at shipment, the gradient correction coefficient on that temperature side has only to be altered on the basis of the data, an operation easily performed during shipping inspection.

Although in this embodiment description has been made of the case in which the second frequency varying means 15 consists of two sets of variable conversion coefficient analog converters and variable capacitance circuits, it may be comprised of three or more sets of analog converters and variable capacitance circuits so as to ensure a more accurate gradient correction.

Although the embodiments of the present invention have been specifically described, the present invention is not intended to be limited to the embodiments and it may naturally be modified in various manners as needed.

For instance, the variable conversion coefficient analog converter 8 shown in FIG. 3 employs as its reference system the high potential side power source, that is, the Vcc side, but instead it may employ the ground side as its reference system.

To summarize again the effects of the invention, the frequency varying means arranged in the temperature compensated crystal oscillator are divided into the linearizing correction means, gradient correction means and f0 adjustment means, with the gradient correction coefficients being determined by only two points of temperature information at the reference temperature and an other temperature so as to make it possible to greatly reduce the time taken to adjust the temperature compensation of the oscillating frequency. In addition, it is also possible to curtail the costs for making the mis-aligned products into non-defective products during inspection at shipment thereby achieving a low price temperature compensated crystal oscillator.

What is claimed is:

1. A temperature compensated crystal oscillator comprising:

crystal oscillating means having an AT-cut crystal resonator;

linearizing correction means for transforming a temperature characteristic curve of an oscillating frequency of the crystal resonator into a straight line using a fixed coefficient common to all crystal resonators;

gradient correction means for eliminating a gradient of said temperature characteristic curve, which has been linearized by said linearizing correction means, using a variable coefficient depending on the type of crystal resonator; and f0 adjustment means for adjusting said temperature characteristic curve, whose gradient has been corrected by said gradient correction means, so as to cause the oscillating frequency to lie within an allowable range, wherein said linearizing correction means, said gradient correction means and said adjusting means are independent of each other.

2. A temperature compensated crystal oscillator comprising:

crystal oscillating means having an AT-cut crystal resonator;

a non-volatile memory for storing therein gradient correction information and f0 adjustment information of a temperature characteristic of said AT-cut crystal resonator;

an analog voltage output temperature sensor for providing temperature information on said crystal oscillating means in the form of analog signals;

first frequency varying means consisting of a first analog converter for converting an output voltage of said analog voltage output temperature sensor into another voltage with a fixed conversion coefficient, and a first variable capacitance circuit for varying a capacitance of said crystal oscillating means in response to an output signal from said first analog converter;

second frequency varying means consisting of a second analog converter for converting an output voltage from said analog voltage output temperature sensor into another voltage with a conversion coefficient varied on the basis of the gradient correction information of said non-volatile memory, and a second variable capacitance circuit for varying the capacitance of said crystal oscillating means in response to an output signal from said second analog converter; and third frequency varying means consisting of a D/A converter for converting f0 adjustment information of said non-volatile memory into an analog voltage, and information of a third variable capacitance circuit for varying the capacitance of said crystal oscillating means in response to an output signal from said D/A converter.

3. The temperature compensated crystal oscillator according to claim 2, wherein said first frequency varying means divides a temperature range to be compensated into a plurality of segments, wherein said first analog converter consists of a plurality of analog converters for voltage converting the output voltage of said temperature sensor using conversion coefficients differing on a segment-by-segment basis within said temperature range, and said first variable capacitance circuit consists of a plurality of variable capacitance circuits for varying the capacitance of said crystal oscillating means in response to output signals from said plurality of analog converters.

4. The temperature compensated crystal oscillator according to claim 2, wherein said second frequency varying means divides a temperature range to be compensated into a plurality of segments, wherein said second analog converter consists of a plurality of analog converters for voltage converting the output voltage of said temperature sensor using variable conversion coefficients on a segment-by-segment basis within said temperature range, and said second variable capacitance circuit consists of a plurality of variable capacitance circuits for varying the capacitance of said crystal oscillating means in response to output signals from said plurality of analog converters.

5. The temperature compensated crystal oscillator according to claim 3, wherein said plurality of segments segmenting the temperature range to be compensated consists of two segments on a high temperature side and a low temperature side with respect to a point of inflection on a temperature characteristic curve of said AT-cut crystal resonator.

6. The temperature compensated crystal oscillator according to claim 4, wherein said plurality of segments segmenting the temperature range to be compensated consists of two segments on a high temperature side and a low temperature side with respect to a reference temperature.

7. The temperature compensated crystal oscillator according to claim 2, wherein said first frequency varying means divides a temperature range to be compensated into a plurality of segments, wherein said first analog converter consists of a plurality of analog converters for voltage converting the output voltage of said temperature sensor using conversion coefficients differing on a segment-by-segment basis within said temperature range, and said first variable capacitance circuit consists of a plurality of variable capacitance circuits for varying the capacitance of said crystal oscillating means in response to output signals from said plurality of analog converters, and said second frequency varying means divides a temperature range to be compensated into a plurality of segments, and said second analog converter consists of a plurality of analog converters for voltage converting the output voltage of said temperature sensor using variable conversion coefficients on a segment-by-segment basis within said temperature range, and said second variable capacitance circuit consists of a plurality of variable capacitance circuits for varying the capacitance of said crystal oscillating means in response to output signals from said plurality of analog converters.

8. The temperature compensated crystal oscillator according to claim 7, wherein said plurality of segments segmenting the temperature range to be compensated in said first frequency varying means consists of two segments on a high temperature side and a low temperature side with respect to a point of inflection on a temperature characteristic curve of said AT-cut crystal resonator, and said plurality of segments segmenting the temperature range to be compensated in said second frequency varying means consists of two segments on the high temperature side and the low temperature side with respect to a reference temperature.

9. The temperature compensated crystal oscillator according to claim 2, wherein said first frequency varying means, said second frequency varying means and said third frequency varying means are connected in parallel with said crystal oscillating means.

10. The temperature compensated crystal oscillator according to claim 3, wherein said first frequency varying means, said second frequency varying means and said third frequency varying means are connected in parallel with said crystal oscillating means.

11. The temperature compensated crystal oscillator according to claim 4, wherein said first frequency varying means, said second frequency varying means and said third frequency varying means are connected in parallel with said crystal oscillating means.

12. The temperature compensated crystal oscillator according to claim 7, wherein said first frequency varying means, said second frequency varying means and said third frequency varying means are connected in parallel with said crystal oscillating means.

* * * * *

UNITED STATES PATENT AND TRADEMARK OFFICE
CERTIFICATE OF CORRECTION

PATENT NO.: 5,986,515
DATED : November 16, 1999
INVENTOR(S): Yasuhiro SAKURAI

It is certified that an error appears in the above-identified patent and that said Letters Patent is hereby corrected as shown below:

Line 19 of claim 1, change "... and said adjusting means ..." to be --and said f0 adjustment means ...--

Signed and Sealed this

Twenty-second Day of August, 2000

Attest:

Attesting Officer

Q. TODD DICKINSON

Director of Patents and Trademarks